(12) United States Patent
Laio et al.

(10) Patent No.: US 7,474,541 B2
(45) Date of Patent: Jan. 6, 2009

(54) PRINTED CIRCUIT BOARD AND HEAT DISSIPATING METAL SURFACE LAYOUT THEREOF

(75) Inventors: Tse-Hsine Laio, Xindian (TW); Ting-Kuo Kao, Xindian (TW)

(73) Assignee: Giga-Byte Technology Co., Ltd., Taipei (TW)

( * ) Notice: Subject to any disclaimer, the term of this patent is extended or adjusted under 35 U.S.C. 154(b) by 120 days.

(21) Appl. No.: 11/383,185

(22) Filed: May 12, 2006

(65) Prior Publication Data
US 2007/0261882 A1   Nov. 15, 2007

(51) Int. Cl.
*H05K 7/12* (2006.01)
(52) U.S. Cl. .................................................. 361/808

(58) Field of Classification Search ......... 361/773–776, 361/808
See application file for complete search history.

(56) References Cited

U.S. PATENT DOCUMENTS 6,465,890 B1 * 10/2002 Poddar et al. ............... 257/773

\* cited by examiner

*Primary Examiner*—Dean A. Reichard
*Assistant Examiner*—Abiy Getachew

(57) ABSTRACT

In a printed circuit board and its heat dissipating metal surface layout, a layer of copper foil is coated onto the printed circuit board for dissipating heat, and the surface of the copper foil is covered by an insulating coating, and a bare copper is formed on the surface of copper foil which is not covered by the insulating coating, and the bare copper is arranged in a cross shape, or in the shape of "#", so that when the printed circuit board goes through a soldering furnace, the cohesion of solder is even instead of aggregating at a same position or the center, so as to obtain a larger protruding area and facilitate dissipating heat and transmitting current.

14 Claims, 6 Drawing Sheets

PRINTED CIRCUIT BOARD AND HEAT DISSIPATING METAL SURFACE LAYOUT THEREOF

BACKGROUND OF THE INVENTION

1. Field of the Invention

The present invention relates to a printed circuit board and its heat dissipating metal surface layout, and more particularly to a printed circuit board that goes through a soldering furnace to form a protruding solder at a bare copper position on the printed circuit board, so as to increase the heat dissipating area.

2. Description of Prior Art

To enhance the heat dissipating effect of a printed circuit board (PCB), most of the printed circuit boards add heat dissipating holes, electroplate metal films, install metal lumps on the backside of the printed circuit boards, or directly coat a heat dissipating paste onto the printed circuit boards for dissipating heat.

Referring to FIGS. 1 and 2 for a printed circuit board 1a that uses a copper foil for dissipating heat, the printed circuit board 1a comprises an insulating substrate 10a, a layer of copper foil 11a plated onto the substrate 10a for dissipating heat, and an insulating coating 12a coated onto the surface of the copper foil 11a. To maximize the heat dissipating effect of a limited area of the copper foil 11a, a portion of the insulating coating 120a is usually removed, so that the originally covered copper foil 11a is exposed to the outside to form a bare copper portion 110a, and the solder 13a is attached onto the bare copper portion 110a by a soldering furnace, such that the strong cohesion of the solder aggregates a certain amount of solder to form a protruding thickness, so as to increase the exposed surface area for dissipating heat.

Referring to FIG. 3 together, the removal of the insulating coating 120a is usually done by using a slender shape and a layout with intervals arranged in a single direction. Although such arrangement can avoid an excessively large area of a bare copper portion 110a and provide an even protrusion of the solder 13a, yet the cohesion and adhesion along the lengthwise direction are still uneven thus causing a larger thickness at the middle and a smaller thickness on both sides. Such phenomenon is caused by the uneven adhesion between the center and both sides and the uneven cohesion of the solder when the liquid solder is attached onto the copper foil, and thus more solders 13a are aggregated towards the center, and insufficient solders are provided for the natural formation of the protrusion on both sides. The relative surface area is smaller, and the cross-sectional shape of the solder 13a along the lengthwise direction is inconsistent, which adversely affects the transmission of current.

In view of the description above, the inventor of the present invention designed a feasible solution to effectively overcome the foregoing shortcomings.

SUMMARY OF THE INVENTION

In view of the foregoing shortcomings of the prior art, the inventor of the present invention based on years of experience in the related industry to conduct experiments and modifications, and finally designed a printed circuit board and its heat dissipating metal surface layout in accordance with the present invention to overcome the shortcomings of the prior art.

The present invention is to overcome the shortcomings of the prior art by providing a printed circuit board and its heat dissipating metal surface layout that alternately arrange the shape or design of a bare copper portion or solder to even the cohesion of the solder, so that the solder can be attached evenly onto the surface of the bare copper to achieve a larger consistent cross-sectional shape and effectively increase the surface area of the protruding solder and facilitate the transmission of current.

The invention provides a printed circuit board that comprises a substrate, a heat dissipating layer disposed on a surface of the substrate, and an adhering layer. The adhering layer further includes a plurality of adhering bars disposed alternately in a first direction and a second direction and attached onto the surface of the heat dissipating layer to form a protruding surface.

The invention provides a heat dissipating metal surface layout of a printed circuit board, and the printed circuit board includes a metal heat dissipating layer and an insulating coating evenly coated onto the heat dissipating layer, wherein the surface heat dissipating layer that is not covered by the insulating coating forms an exposed metal surface, and the metal surface is arranged alternately in a first direction and a second direction.

BRIEF DESCRIPTION OF DRAWINGS

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

The technical characteristics, features and advantages of the present invention will become apparent in the following detailed description of the preferred embodiments with reference to the accompanying drawings. However, the drawings are provided for reference and illustration only and are not intended for limiting the scope of the invention.

Figure 1:
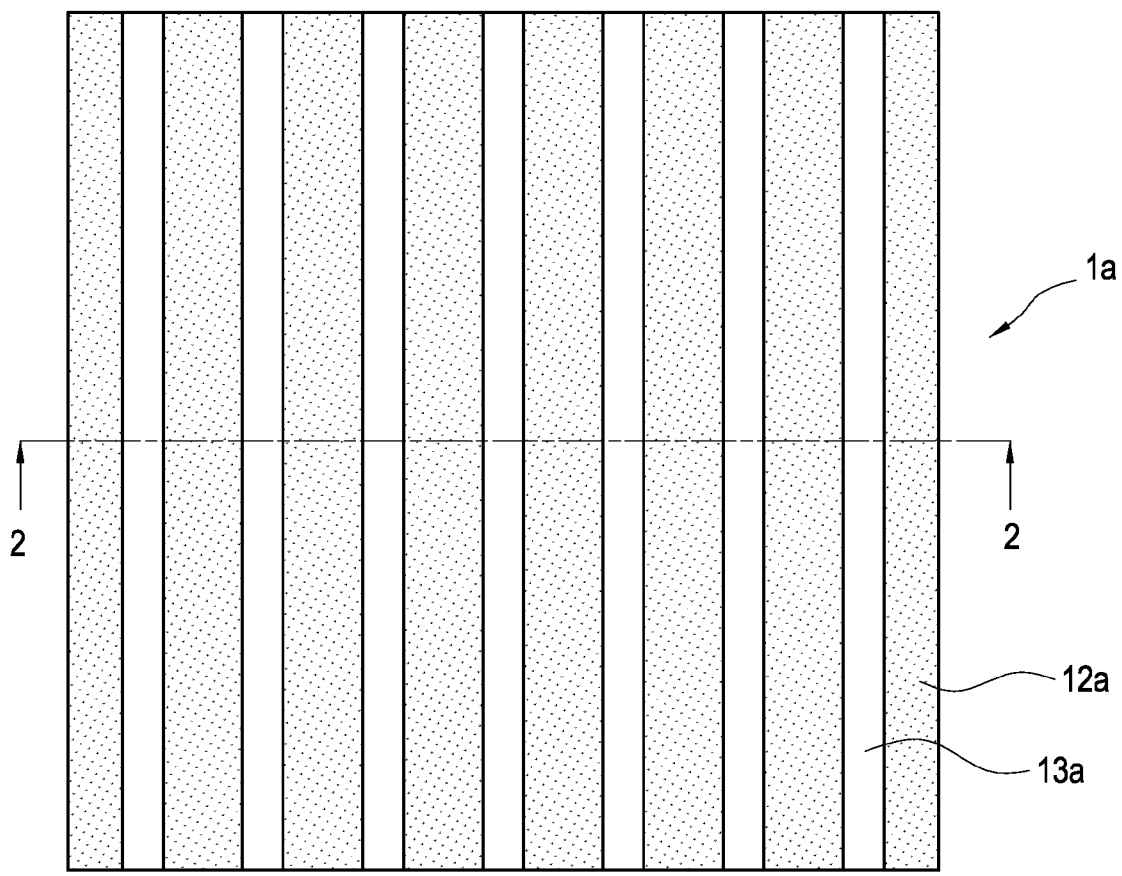
FIG. 1 is a schematic planar view of a prior art printed circuit board.
Figure 2:
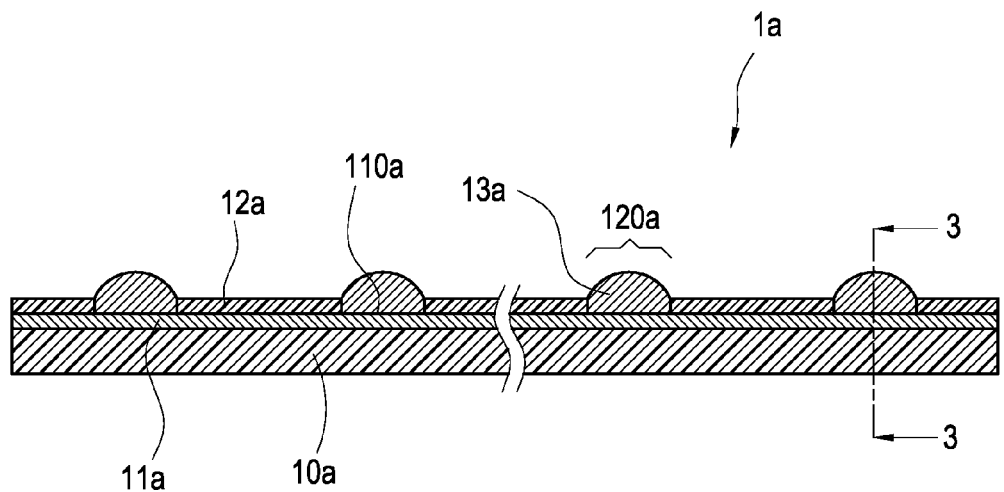
FIG. 2 is a cross-sectional view of line 2-2 as depicted in FIG. 1.
Figure 3:
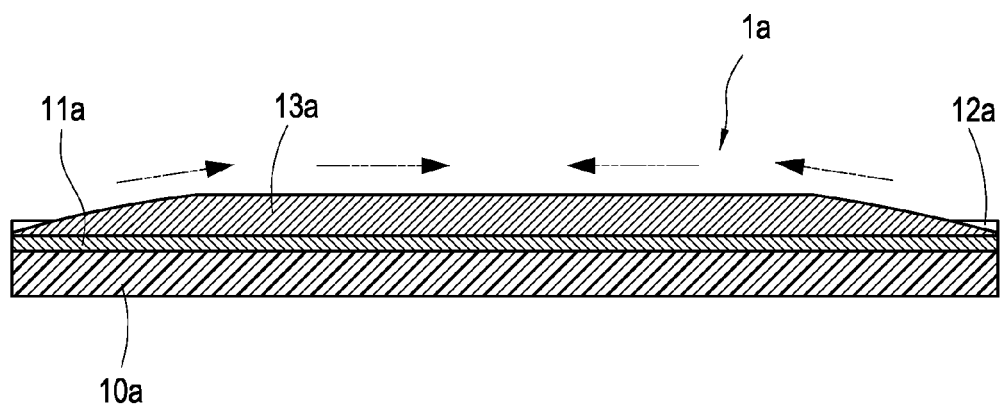
FIG. 3 shows a cross-sectional view of line 3-3 as depicted in FIG. 2 and a schematic view of the solder aggregating direction.
Figure 4:
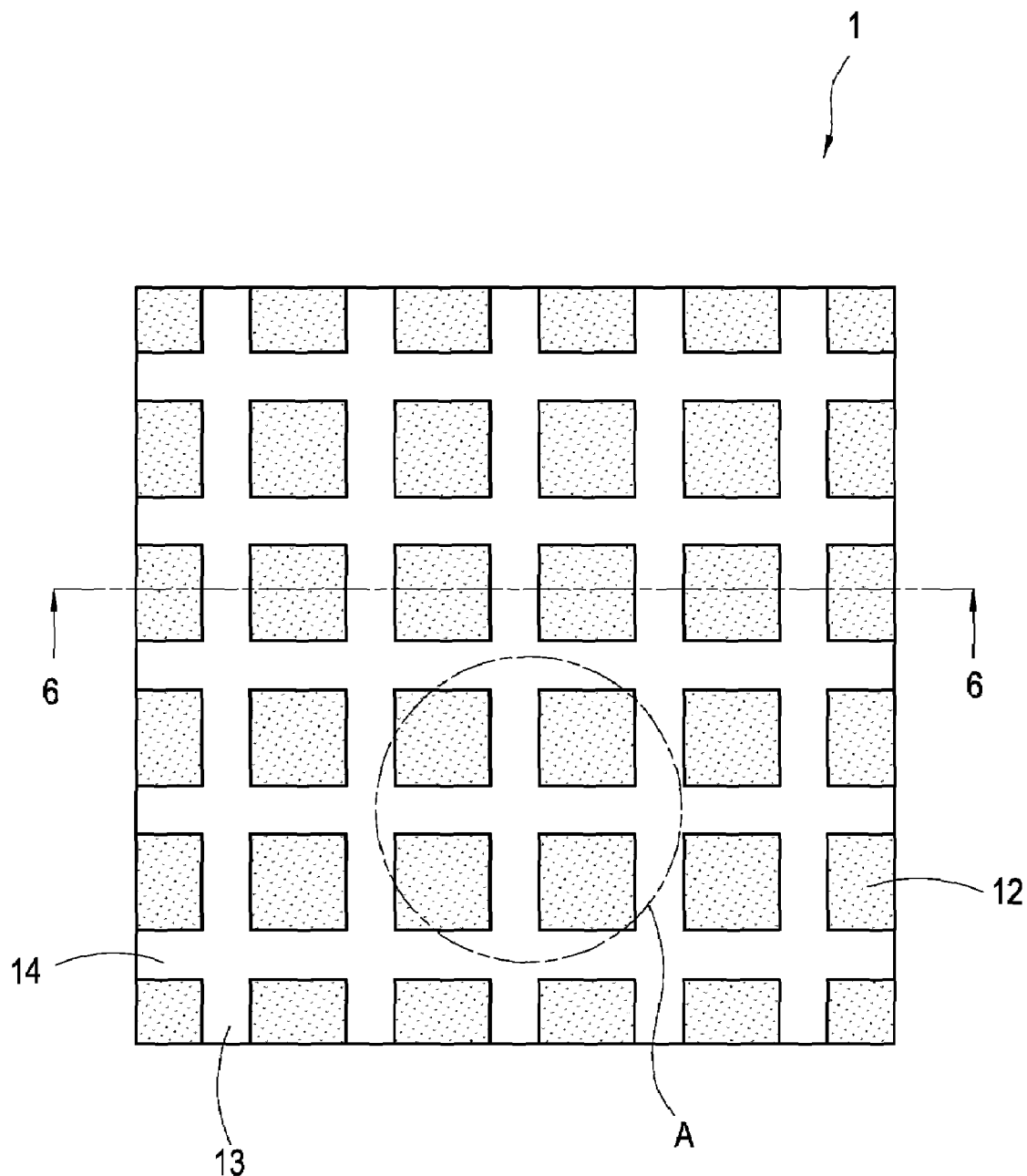
FIG. 4 is a schematic planar view of the present invention.
Figure 5:
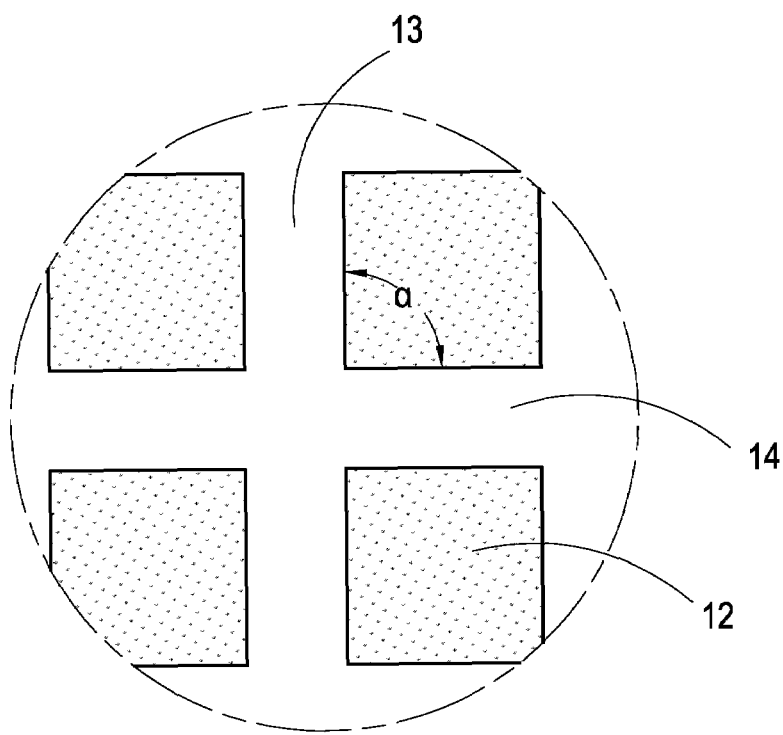
FIG. 5 is an enlarged view of portion A as depicted in FIG. 4.
Figure 6:
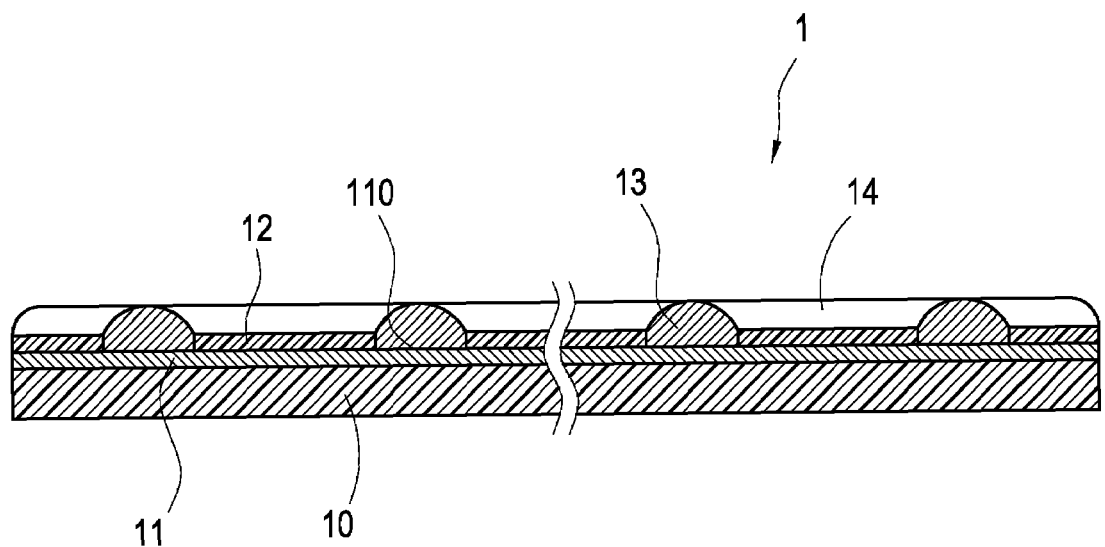
FIG. 6 is a cross-sectional view of line 6-6 as depicted in FIG. 4.

Referring to FIGS. 4 and 6 for the schematic planar view of the invention and the cross-sectional view of line 6-6 as depicted in FIG. 4, respectively, the present invention provides a printed circuit board and its heat dissipating metal surface layout, and the printed circuit board 1 comprises a substrate 10 made of an insulating material and a heat dissipating layer 11 disposed on a surface of the substrate 10. The heat dissipating layer 11 can be made of a copper foil or other heat conducting metals and an insulating coating 12 is coated onto the surface of the heat dissipating layer 11.

The insulating coating 12 is distributed in blocks on the surface heat dissipating layer 11, but the manufacturing process of the invention coats an entire layer of insulating coating 12 onto the surface of the heat dissipating layer 11 first, and then removes the extra insulating coating 12, so that a portion of the surface of the heat dissipating layer 11 can be exposed to the outside, and finally the blocks of the insulating coating 12 as shown in FIG. 4 are produced. For the portion of the surface of the heat dissipating layer 11 that is not covered by the insulating coating 12, a metal surface 110 exposed to the outside is formed, and such metal surface 110 is generally called a bare copper.

Figure 8:
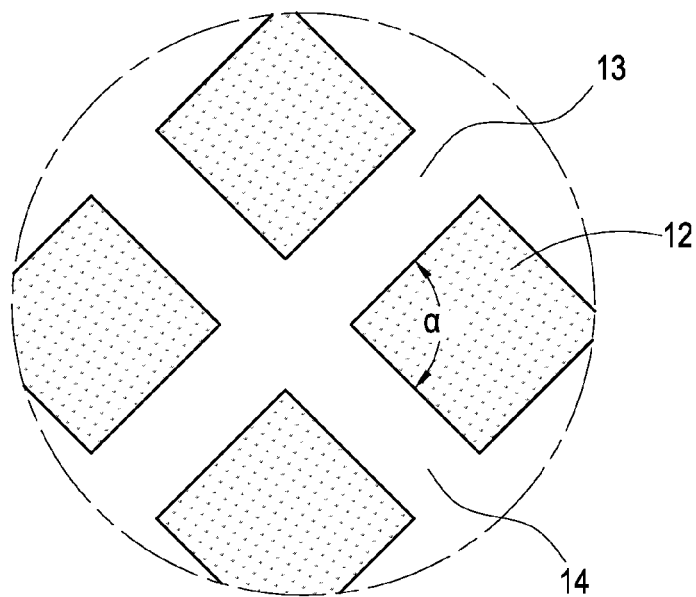
FIG. 8 is a schematic view of a portion of another preferred embodiment of the present invention.
Figure 9:
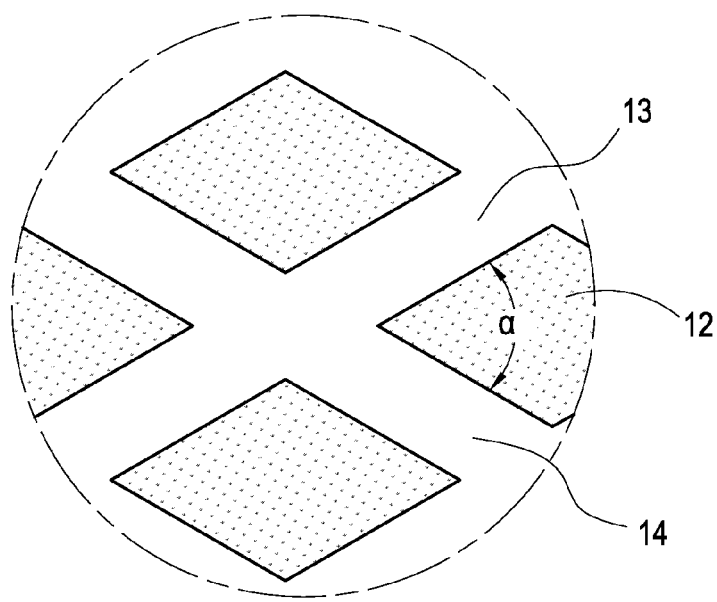
FIG. 9 is a schematic view of a portion of a further preferred embodiment of the present invention.

The invention primarily forms a layout of a metal surface 110 alternately arranged in a first direction 13 and a second direction 14. In the preferred embodiment as shown in FIG. 4, the so-called first direction 13 is a longitudinal direction and the second direction 14 is a transversal direction, and thus an included angle α of 90° is formed between the first and second directions 13, 14, and the two directions perpendicularly intersect with each other, and the layout of the metal surface 110 is in a cross shape or in the shape of "#". In FIG. 8, the first and second directions 13, 14 could be intersected slantingly. In FIG. 9, the included angle α between the first and second directions 13, 14 also could be 30°, 45° or 60°, and the embodiment shown in FIG. 9 has an included angle of 60°.

Figure 7:
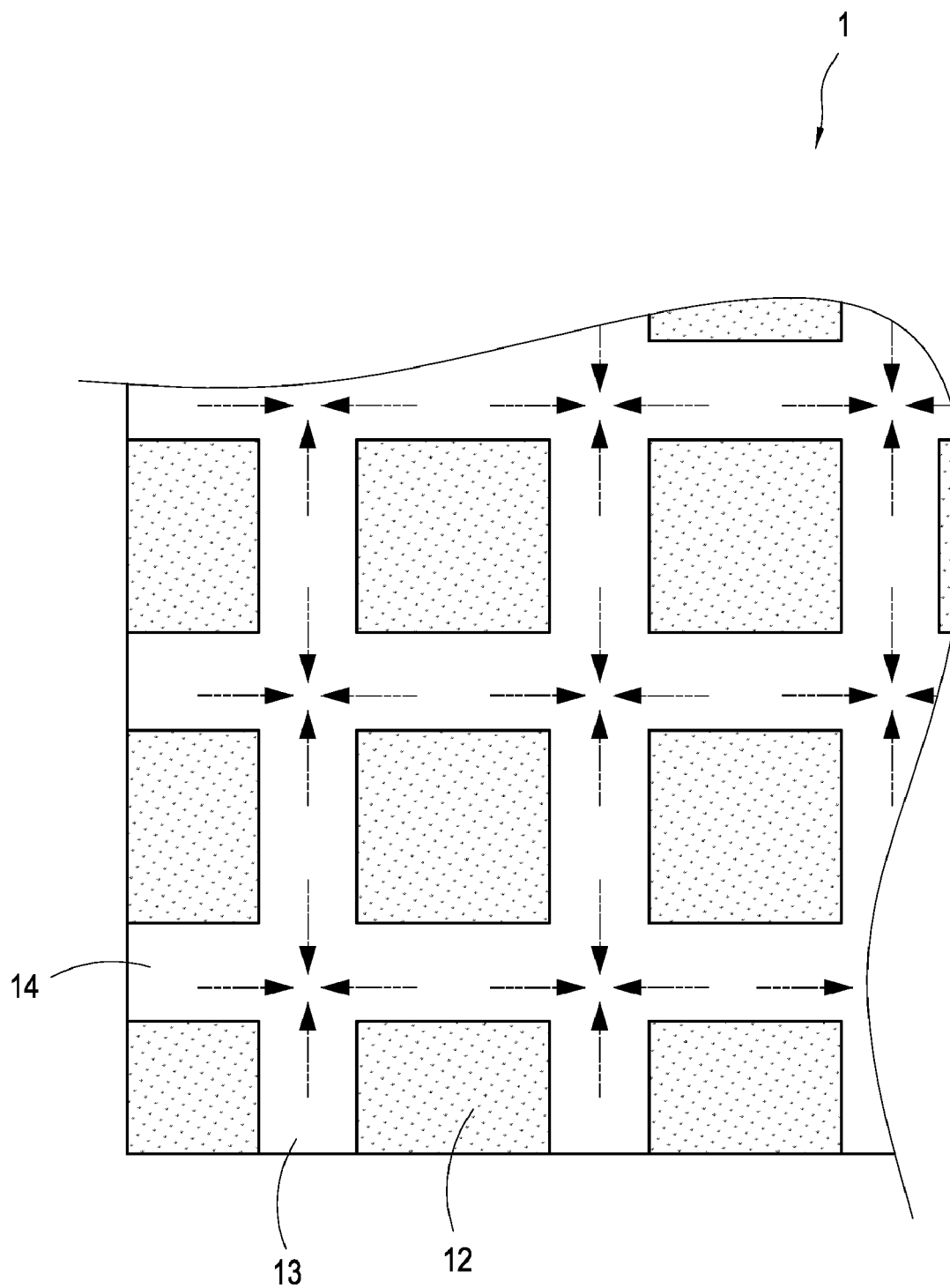
FIG. 7 is a schematic view of a solder aggregating direction according to the present invention.

Refer to FIGS. 6 and 7. Since a slightly wide small area can be provided at each intersection of the first and second directions, therefore the liquid solder can be aggregated at the center of the small area in the process of attaching the solder to the metal surface 110 when the printed circuit board 1 of the invention goes through a soldering furnace. As a result, the cohesion of the solder is even instead of being aggregated at a same position or the center, so that an adhering layer made of the solder is formed on the metal surface 110. The adhering layer also forms solid solder bars along the first and second directions 13, 14, such that each solder has a protruding height and an evener surface that give a larger protruding area for facilitating heat dissipation and current transmission.

With the foregoing structure, the printed circuit board and its heat dissipating metal surface layout in accordance with the present invention can be achieved.

In summation of the above description, the present invention herein enhances the performance than the conventional structure and further complies with the patent application requirements and is submitted to the Patent and Trademark Office for review and granting of the commensurate patent rights.

The present invention are illustrated with reference to the preferred embodiment and not intended to limit the patent scope of the present invention. Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. A printed circuit board, comprising:
   a substrate;
   a heat dissipating layer, disposed on a surface of the substrate with a first surface in contact with the surface of the substrate;
   an adhering layer, including a plurality of solid adhering bars disposed alternately in a first direction and a second direction and adhered onto a second surface of the heat dissipating layer opposite to the first surface to form a protruding surface for each solid adhering bar; and
   an insulating coating formed on the second surface of the heat dissipation layer to fill between the solid adhering bars.

2. The printed circuit board of claim 1, wherein the heat dissipating layer is a copper foil.

3. The printed circuit board of claim 1, wherein the adhering layer is made of a solder.

4. The printed circuit board of claim 2, wherein the adhering layer is made of a solder.

5. The printed circuit board of claim 1, wherein the first direction of the adhering bar is a longitudinal direction, and the second direction of the adhering bar is a transversal direction.

6. The printed circuit board of claim 1, wherein the first and second directions of the adhering bar perpendicularly intersect with each other.

7. The printed circuit board of claim 1, wherein the first and second directions of the adhering bar slantingly intersect with each other.

8. The printed circuit board of claim 1, wherein the first and second directions of the adhering bar form an included angle of 30°, 45°, 60° or 90°.

9. A heat dissipating metal surface layout of a printed circuit board, comprising a metal heat dissipating layer disposed on a substrate of the printed circuit board by a first surface and an insulating coating covered onto a second surface of the heat dissipating layer opposite to the first surface,
   wherein the second surface of the heat dissipating layer not covered by the insulating coating forms a bare metal surface, and the bare metal surface is in a shape defined by alternately intersecting a first direction and a second direction, and an adhering layer is filled on the bare metal surface to form a protruding surface on each of the first and second directions.

10. The heat dissipating metal surface layout of a printed circuit board of claim 9, wherein the heat dissipating layer is a copper foil.

11. The heat dissipating metal surface layout of a printed circuit board of claim 9, wherein the first direction is a longitudinal direction and the second direction is a transversal direction.

12. The heat dissipating metal surface layout of a printed circuit board of claim 9, wherein the first and second directions perpendicularly intersect with each other.

13. The heat dissipating metal surface layout of a printed circuit board of claim 9, wherein the first and second directions slantingly intersect with each other.

14. The heat dissipating metal surface layout of a printed circuit board of claim 9, wherein the first and second directions form an included angle of 30°, 45°, 60° or 90°.

* * * * *